(12) United States Patent
Rangarajan et al.

(10) Patent No.: US 6,524,944 B1
(45) Date of Patent: Feb. 25, 2003

(54) LOW K ILD PROCESS BY REMOVABLE ILD

(75) Inventors: Bharath Rangarajan, Santa Clara, CA (US); Ramkumar Subramanian, San Jose, CA (US); Michael K. Templeton, Atherton, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/617,374

(22) Filed: Jul. 17, 2000

(51) Int. Cl.⁷ .......................................... H01L 21/4763
(52) U.S. Cl. ...................... 438/623; 438/421; 438/422; 438/634; 438/778; 257/642; 257/758; 257/759; 257/760
(58) Field of Search ................................ 438/422, 619, 438/623, 634, 622, 778, 790, 421; 257/759, 760, 642, 635, 758, 751, 774

(56) References Cited

U.S. PATENT DOCUMENTS

| | | | |
|---|---|---|---|
| 5,324,683 A | * 6/1994 | Fitch et al. | 438/422 |
| 5,461,003 A | * 10/1995 | Havemann et al. | 438/666 |
| 5,744,399 A | * 4/1998 | Rostoker et al. | 438/622 |
| 5,886,410 A | * 3/1999 | Chiang et al. | 257/759 |
| 5,936,295 A | * 8/1999 | Havemann et al. | 257/522 |
| 6,037,664 A | * 3/2000 | Zhao et al. | 257/758 |
| 6,057,224 A | 5/2000 | Bothra et al. | 438/619 |
| 6,072,227 A | * 6/2000 | Yau et al. | 257/642 |
| 6,143,646 A | * 11/2000 | Wetzel | 438/637 |
| 6,159,842 A | * 12/2000 | Chang et al. | 438/622 |
| 6,313,046 B1 | 11/2001 | Juengling et al. | 438/781 |
| 6,323,297 B1 | * 11/2001 | Lee et al. | 526/251 |

FOREIGN PATENT DOCUMENTS

| | | | |
|---|---|---|---|
| EP | 0333132 | 9/1989 | H01L/23/52 |
| EP | 0872887 | 10/1998 | H01L/23/48 |
| JP | 10284602 | 10/1998 | H01L/21/768 |
| WO | 9832169 | 7/1998 | H01L/21/768 |

OTHER PUBLICATIONS

International Search Report.

\* cited by examiner

*Primary Examiner*—Olik Chaudhuri
*Assistant Examiner*—Hsien Ming Lee
(74) *Attorney, Agent, or Firm*—Amin & Turocy, LLP

(57) ABSTRACT

One aspect of the present invention relates to a method of forming an advanced low k material between metal lines on a semiconductor substrate, involving the steps of providing the semiconductor substrate having a plurality of metal lines thereon; depositing a spin-on material over the semiconductor substrate having the plurality of metal lines thereon; and at least one of heating or etching the semiconductor substrate whereby at least a portion of the spin-on material is removed, thereby forming the advanced low k material comprising at least one air void between the metal lines, the advanced low k material having a dielectric constant of about 2 or less. Another aspect of the present invention relates to a method of forming a semiconductor structure, involving the steps of forming a first plurality of metal lines on the semiconductor structure; depositing a spin-on material over the semiconductor substrate having the plurality of metal lines thereon; forming a plurality of openings in the spin-on material exposing a portion of the metal lines and depositing metal to form a plurality of metal vias in the openings; forming a second plurality of metal lines over at least a portion of the metal vias; and at least one of heating or etching the semiconductor structure whereby at least a portion of the spin-on material is removed, thereby forming an advanced low k material comprising at least one air void, the advanced low k material having a dielectric constant of about 2 or less.

8 Claims, 3 Drawing Sheets

LOW K ILD PROCESS BY REMOVABLE ILD

TECHNICAL FIELD

The present invention generally relates to processing a semiconductor substrate by employing low k dielectric materials. In particular, the present invention relates to forming an advanced low k material by partially or entirely removing another dielectric material.

BACKGROUND ART

An integrated circuit consists of electronic devices electrically coupled by conductive trace elements called interconnect lines (interconnects). Interconnects are patterned from layers of electrically conductive materials (e.g., metals such as aluminum and/or copper, doped polysilicon, etc.) formed on the surface of a silicon wafer. Multiple layers (or levels) of closely-spaced interconnects allow an increase in the density of devices formed on semiconductor wafers. Electrical separation of stacked interconnect layers is achieved by placing an electrically insulating material (i.e., interlevel dielectric layer) between the vertically spaced interconnect layers. Multiple lines of closely-spaced interconnects on a single level also allow an increase in the density of devices formed on semiconductor wafers. Electrical separation of adjacent interconnect lines is achieved by placing an electrically insulating material (i.e., innerlayer dielectric) between the conductive interconnect lines.

Many types of materials are employed as insulating materials. Examples include oxides, silicates, nitrides, low k materials, and air. These insulating materials have different properties and characteristics; thus, different insulating materials are used depending upon the requirements of a given environment. Although air lacks the structural integrity of oxides, silicates, nitrides, and low k materials, air is the cheapest and has the lowest dielectric constant (about 1). Therefore, in many instances it is desirable to employ air as an insulating material. The requirement of structural integrity, however, limits the extent to which air is employed in semiconductor manufacturing.

In very large scale integrated (VLSI) circuit devices, several wiring layers each containing numerous interconnect lines are often required to connect together the active and/or passive elements in a VLSI semiconductor chip. The interconnection structure typically consists of thin conductive lines separated by insulation in one layer or level and connected through vias or studs from contacts of the elements of the semiconductor chip or to a similar layer in another level of interconnections. With the trend to higher and higher levels of integration in semiconductor devices to ultra large scale integrated (ULSI) circuits, the space or gap between the wires or conductive lines to be filled with insulation is becoming extremely narrow, such as about 0.18 microns and smaller. In addition, when the height of the conductive lines is increased, it is more difficult to fill gaps between the lines, especially when the aspect ratio is 2 to 1 or greater with a gap distance of 0.25 microns or smaller.

In order to satisfy increasingly higher density requirements, the dimensions of integrated circuits are continuously reduced and, hence, the line widths of the conductors decreased into the submicron range. While the there is as trend for conductors to become narrower and narrower, there is also a trend for the spaces between conductors to become narrower and narrower. As a result, there is an increasing and unmet need for high performance insulation materials.

SUMMARY OF THE INVENTION

The present invention provides an advanced low k material by partially or entirely removing another dielectric material, thereby providing improved insulation in semiconductor devices. The advanced low k material of the present invention provides excellent insulation between metal lines (as an innerlayer dielectric) and between metal layers (as an interlevel dielectric).

One aspect of the present invention relates to a method of forming an advanced low k material between metal lines on a semiconductor substrate, involving the steps of providing the semiconductor substrate having a plurality of metal lines thereon; depositing a spin-on material over the semiconductor substrate having the plurality of metal lines thereon; and at least one of heating or etching the semiconductor substrate whereby at least a portion of the spin-on material is removed, thereby forming the advanced low k material comprising at least one air void between the metal lines, the advanced low k material having a dielectric constant of about 2 or less.

Another aspect of the present invention relates to a method of forming a semiconductor structure, involving the steps of forming a first plurality of metal lines on the semiconductor structure; depositing a spin-on material over the semiconductor substrate having the plurality of metal lines thereon; forming a plurality of openings in the spin-on material exposing a portion of the metal lines and depositing metal to form a plurality of metal vias in the openings; forming a second plurality of metal lines over at least a portion of the metal vias; and at least one of heating or etching the semiconductor structure whereby at least a portion of the spin-on material is removed, thereby forming an advanced low k material comprising at least one air void, the advanced low k material having a dielectric constant of about 2 or less.

Yet another aspect of the present invention relates to a method of forming a semiconductor structure, involving the steps of forming a first plurality of metal lines on the semiconductor structure; depositing a spin-on material over the semiconductor substrate having the plurality of metal lines thereon, wherein the spin-on material is a silicate or a low k polymer material; forming a plurality of openings in the spin-on material exposing a portion of the metal lines and depositing metal to form a plurality of metal vias in the openings; forming a second plurality of metal lines over at least a portion of the metal vias; and heating the semiconductor structure whereby a portion of the spin-on material is removed, thereby forming a porous advanced low k material comprising a plurality of voids, the porous advanced low k material having a dielectric constant of about 1.75 or less.

DISCLOSURE OF INVENTION

The present invention involves providing an advanced low k material between metal lines and/or between metal layers by partially or entirely removing another dielectric material. The dielectric constant of the advanced low k material of the present invention approaches 1; thus, the advanced low k material provides excellent insulation enabling increased integration on a semiconductor wafer.

The advanced low k material is made by initially depositing a spin-on material onto the semiconductor structure. The spin-on material is partially removable, substantially or entirely removable, as will be discussed below. Spin-on materials include silicates and low k polymer materials. Silicates include fluorine doped silicon glass (FSG), tetraethylorthosilicate (TEOS), phosphosilicate glass (PSG), borophosphosilicate glass (BPSG), any other suitable spin-on glass.

Low k polymer materials include one or more of polyimides, fluorinated polyimides, polysilsequioxane, benzocyclobutene (BCB), poly(arylene ester), parylene F, parylene N and amorphous polytetrafluoroethylene. Specific examples of a commercially available low k materials include those under the trade designations Flare™ from AlliedSignal, believed to be derived from perfluorobiphenyl and aromatic bisphenols; Black Diamond™ from Applied Materials; ALCAP-S from Asahi Chemical; SiLK® and Cyclotene® BCB from Dow Chemical; Teflon® polytetrafluoroethylene from DuPont; XLK and 3MS from Dow Corning; HSG RZ25 from Hitachi Chemical; HOSP™ and Nanoglass™ from Honeywell Electronic Materials; LKD from JSR Microelectronics; CORAL™ and AF4 from Novellus; mesoporous silica from Battelle PNNL; and VeloX™ PAE-2 from Schumacher.

The thickness of the spin-on material varies, and is not critical to the present invention. In one embodiment, the thickness of the spin-on material is from about 1,000 Å to about 30,000 Å (the thickness determined by the distance from the substrate surface (and not from the top of any features on the substrate) to the top of the spin-on material). In another embodiment, the thickness of the spin-on material is from about 2,500 Å to about 20,000 Å. In yet another embodiment, the thickness of the spin-on material is from about 5,000 Å to about 15,000 Å.

Once the spin-on material is deposited onto the semiconductor structure, the structure may be optionally baked to drive off excess casting solvent, if appropriate. The spin-on material formed on the semiconductor structure is subjected to a removal treatment; that is, it is at least partially removed. It is noted that further processing may be conducted on the semiconductor structure after the spin-on material is initially formed on the semiconductor structure and before the removal treatment (such as the formation of metal structures or semiconductor devices).

Figure 7:
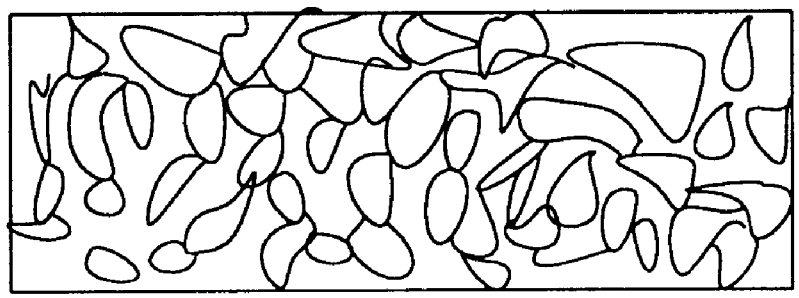
FIG. 7 illustrates a cross-sectional view of an advanced low k material according to one aspect of the present invention.

The removal treatment involves removing at least a portion of the spin-on material and leaving air or a vacuum in the space occupied by the removed material using any suitable means. The removal treatment typically involves at least one of etching and heating the spin-on material clad semiconductor structure. In embodiments where the spin-on material is substantially or entirely removed from the semiconductor structure, an air void or vacuum is formed in the space. In embodiments where the spin-on material is partially removed, air voids or vacuum pockets are interdispersed throughout the remaining portion of the spin-on material (basically forming aporous structure or "spongy" type material). This is illustrated in FIG. 7 and discussed later. Since the dielectric constant of air/vacuum is 1, an excellent advanced low k material is provided by the present invention.

Etching involves contacting the spin-on material clad semiconductor structure with a material that selectively dissolves the spin-on material while not substantially damaging or deleteriously effecting other features such as metal structures. The specific etchant depends upon the specific identity of the spin-on material. The etching conditions employed can be determined by one skilled in the art.

Dry or wet etching techniques may be employed. Wet etch techniques involve using an acid or organic solvent. Acids include hydrofluoric acid, phosphoric acid, hydrobromic acid, and boric acid. In one embodiment, a dilute acid solution is employed to (at least partially) remove spin-on material. Organic solvents include alcohols, ketones, esters, ethers, aromatic compounds, alkanes, and the like.

Dry etch techniques typically involve using a plasma containing fluorine or chlorine compounds, such as one or more of $BCl_3$, $CCl_4$, $SiCl_4$, $O_2$, $Cl_2$, HBr, $NF_3$, $SF_6$, $CH_3F$, $CF_4$ and $CHF_3$. One or more inert gases may be included in the plasma. In one embodiment, the spin-on material is partially etched using an isotropic etching process.

Heating involves exposing the spin-on material clad semiconductor structure to elevated temperatures so that the spin-on material is at least partially removed (degraded, pyrolized, denatured, etc.) wherein other structures on the semiconductor structure are not substantially damaged or effected by the heat treatment. Heating in one embodiment involves controlled pyrolysis whereby the spin-on material is pyrolized, but other structures on the semiconductor structure are not substantially damaged.

The temperature the spin-on material clad semiconductor structure is exposed to primarily depends upon the length of time of the heat treatment. In one embodiment, the spin-on material clad semiconductor structure is exposed to temperatures from about 500° C. to about 2,000° C. In another embodiment, the spin-on material clad semiconductor structure is exposed to temperatures from about 600° C. to about 1,500° C. In yet another embodiment, the spin-on material clad semiconductor structure is exposed to temperatures from about 700° C. to about 1,300° C.

The length of time the spin-on material clad semiconductor structure is exposed to elevated temperatures primarily depends upon the temperature employed. In one embodiment, the spin-on material clad semiconductor structure is exposed to elevated temperatures from about 2 seconds to about 10 minutes. In another embodiment, the spin-on material clad semiconductor structure is exposed to elevated temperatures from about 10 seconds to about 5 minutes. In yet another embodiment, the spin-on material clad semiconductor structure is exposed to elevated temperatures from about 20 seconds to about 2 minutes.

Any suitable atmosphere may be employed during exposure to elevated temperatures. For example, the heat treatment may take place in air, in a vacuum, in an inert atmosphere (comprising one or more inert gases such one or more of nitrogen, helium, neon, argon, krypton and xenon), and the like. In instances where a vacuum is employed, an exhaust connected to the heating chamber may facilitate removal of particles or remnants of the spin-on material.

The resultant advanced low k materials of the present invention have a dielectric constant approaching 1. In one embodiment, the advanced low k materials of the present invention have a dielectric constant of about 2 or less. In another embodiment, the advanced low k materials of the present invention have a dielectric constant of about 1.75 or less. In yet another embodiment, the advanced low k materials of the present invention have a dielectric constant of about 1.5 or less. In still yet another embodiment, the advanced low k materials of the present invention have a dielectric constant of about 1.25 or less.

FIGS. 1–6 illustrate two embodiments of the methods of the present invention. The method of FIGS. 1–6 may be used with any suitable semiconductor technology including but not limited to NMOS, PMOS, CMOS, BiCMOS, bipolar, multi-chip modules (MCM) and III–IV semiconductors.

Figure 1:
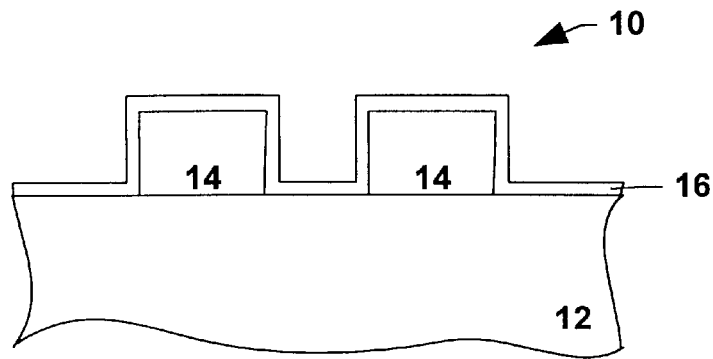
FIG. 1 illustrates a cross-sectional view of a semiconductor substrate having a plurality of metal lines thereon according to one aspect of the present invention.

Referring to FIG. 1, a structure 10 is provided containing a semiconductor substrate 12 having a plurality of metal lines 14 thereon. An optional conformal barrier layer 16 covers the structure 10. With regard to the description in connection with the embodiments of FIGS. 1–6, the term substrate includes not only a semiconductor substrate, such as semiconductor substrate 12, but also any and all layers and structures fabricated over the semiconductor substrate up to the point of processing under discussion. For example, semiconductor substrate 12 may include one or more structures such as active elements and passive elements including polysilicon gates, wordlines, source regions, drain regions, bit lines, bases, emitters, collectors, conductive lines, conductive plugs, diffusion regions, etc.

Metal lines 14 are formed over the substrate 12 by initially forming a conductive material layer, and then using lithography techniques to pattern the layer. The metal lines 14 may be made of any suitable conductive material or materials. Examples of suitable conductive materials include copper, tungsten, gold, silver, aluminum, any alloys and/or combinations thereof. In this embodiment, the conductive material is copper or a copper alloy. The metal lines 14 may be formed to any suitable thickness using any suitable technique. Any two given metal lines 14 may be spaced apart with as little as about 0.25 $\mu$m, about 0.18 $\mu$m, about 0.15 $\mu$m, about 0.12 $\mu$m, and even about 0.1 $\mu$m, space therebetween. Likewise, the width of metal lines 14 may be as little as about 0.25 $\mu$m, about 0.18 $\mu$m, about 0.15 $\mu$m, about 0.12 $\mu$m, and even about 0.1 $\mu$m, or less.

Use of the optional barrier layer 16 depends upon the identity of the conductive material of the metal lines 14. The barrier layer 16 may serve as a diffusion barrier layer preventing conductive material of the metal lines 14 from diffusing into other regions of the structure 10, especially dielectric material regions. The barrier layer 16 is formed over the substrate so that it covers the metal lines 14. The barrier layer 16 may be made of any suitable conductive material or materials. Examples of suitable conductive materials for the barrier layer include titanium nitride, tungsten, tantalum, titanium tungsten, tantalum silicon nitride, tungsten nitride, niobium and molybdenum and combinations thereof. The barrier layer 16 may be formed using any suitable technique to a thickness sufficient to serve as a diffusion barrier for metal lines 14. For example, the thickness of the barrier layer 16 may be in the range from about 100 Å to about 1,500 Å.

In a preferred embodiment, the barrier layer 16 is made of titanium nitride and the metal lines 14 are made of copper or a copper alloy (such as a copper-aluminum alloy). Titanium nitride serves as a diffusion barrier for copper, preventing copper from diffusing into other regions of the structure 10 such as a dielectric layer. In embodiments where the metal lines 14 contain copper, use of a barrier layer is preferred, especially where silicon dioxide is present somewhere on the structure 10. The barrier layer 16 and the metal lines 14 may be initially deposited using CVD techniques or physical vapor deposition (PVD) techniques.

Figure 2:
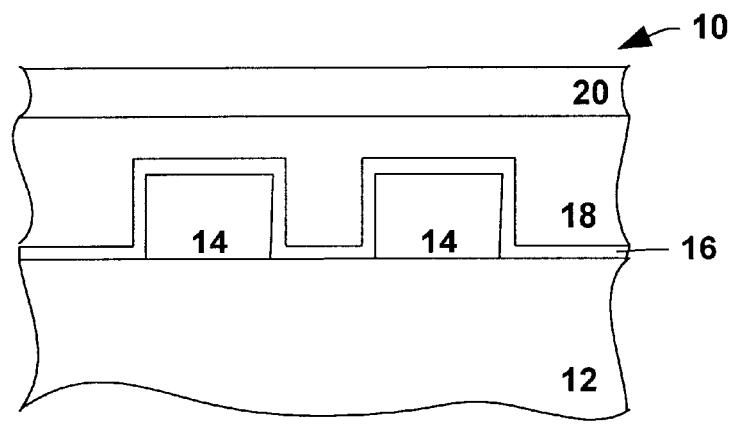
FIG. 2 illustrates a cross-sectional view of a semiconductor substrate according to one aspect of the present invention.

Referring to FIG. 2, a spin-on material layer 18, containing a spin-on material such as a silicate or a low k polymer material, is deposited on the structure 10, and particularly over the barrier layer 16, to any suitable thickness. The spin-on material layer 18 is formed using spin coating techniques. Optionally the structure is then baked to at least one of drive off excess casting solvent and improve adhesion to the underlying surface. After the spin-on material layer 18 is formed, a photoresist layer 20 is formed thereover. Any suitable photoresist material may be employed for the photoresist layer 20.

Figure 3:
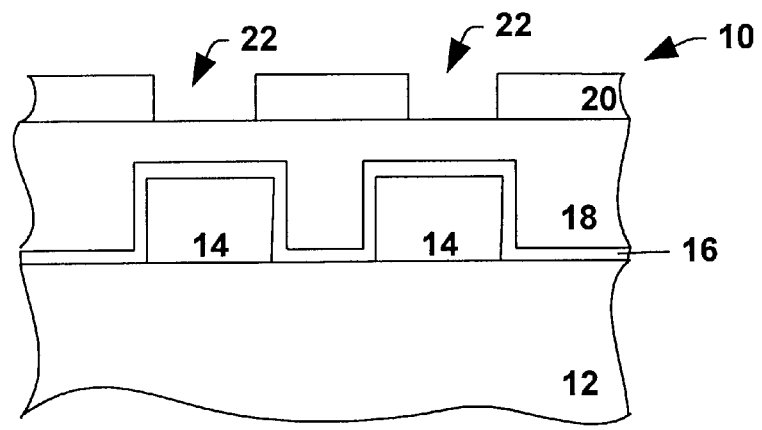
FIG. 3 illustrates a cross-sectional view of a semiconductor substrate according to one aspect of the present invention.

Referring to FIG. 3, the photoresist layer 20 is patterned to form openings 22 for subsequently forming contacts. A portion of the spin-on material layer 18 is exposed in openings 22 as a result of the patterning. Patterning involves irradiating a portion of the photoresist layer 20 using a mask, and removing or developing the irradiated or non-irradiated portions of the photoresist layer 20. Openings 22 may have a larger width, the same width, or have a smaller width than the metal lines 14. The width of openings 22 may be as little as about 0.25 $\mu$m, about 0.18 $\mu$m, about 0.15 $\mu$m, about 0.12 $\mu$m, and even about 0.1 $\mu$m, or less.

Figure 4:
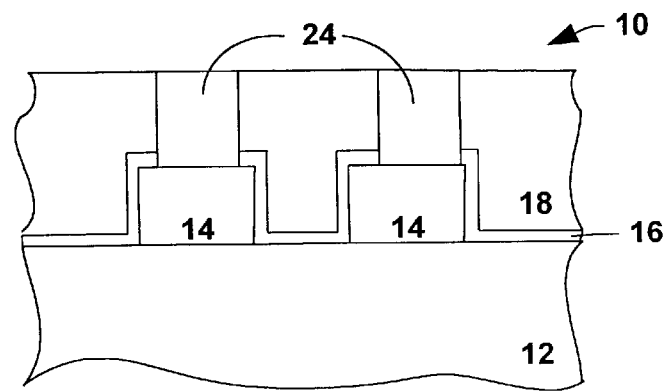
FIG. 4 illustrates a cross-sectional view of a semiconductor substrate having a plurality of metal lines and vias thereon according to one aspect of the present invention.

Referring to FIG. 4, the photoresist layer 20 is used as a mask to etch or selectively remove the exposed portions of the spin-on material layer 18 thereby exposing portions of the barrier layer 16 in openings 22. An anisotropic etch process is preferred. The exposed portions of the barrier layer 16 are then etched or selectively removed thereby exposing portions of the metal lines 14 in openings 22. Again, an anisotropic etch process is preferred. A via 24 made of a conductive material is formed in opening 22. The conductive material may be deposited over the entire structure 10, followed by chemical mechanical polishing (CMP) to planarize the structure 10. Examples of suitable conductive materials for the vias 24 include copper, tungsten, gold, silver, aluminum, any alloys and/or combinations thereof. The photoresist layer 20 is removed or stripped during etching of the spin-on material layer 18, during etching of the barrier layer 16, or as a separate step.

Figure 5:
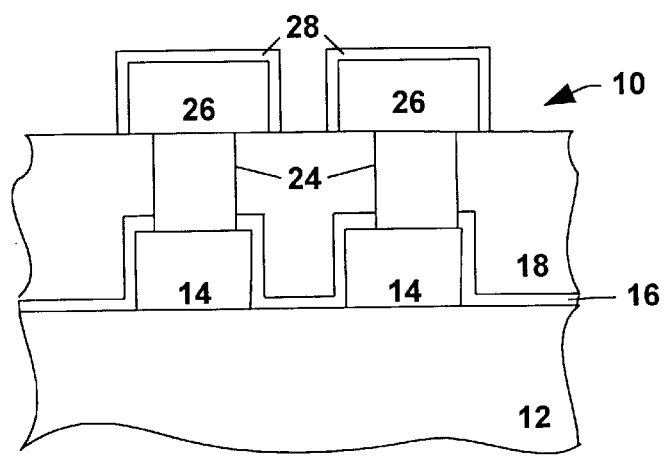
FIG. 5 illustrates a cross-sectional view of a semiconductor substrate having a first and second plurality of metal lines thereon according to one aspect of the present invention.

Referring to FIG. 5, a second plurality of metal lines 26 are formed on the structure 10, preferably over the vias 24. An optional conformal barrier layer 28 covers the plurality of metal lines 26. The materials that form the metal lines 26 and barrier layer 28, the manner in which they are made, the spacing between metal lines, and the widths and size of features are the same as for metal lines 14 and barrier layer 16 discussed above.

Figure 6A:
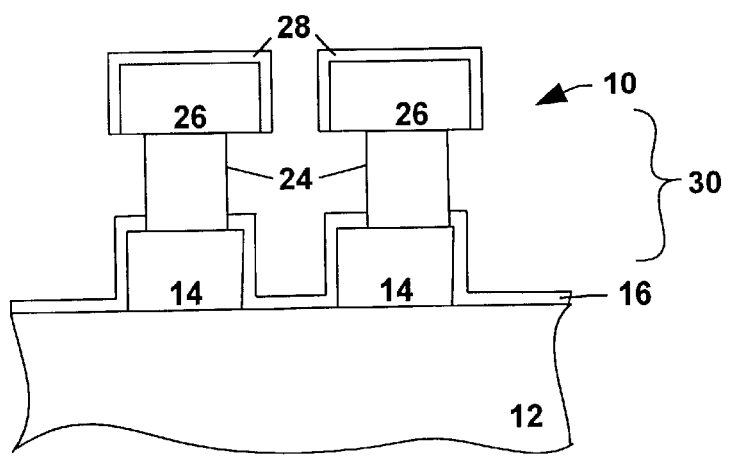
FIG. 6A illustrates a cross-sectional view of a semiconductor substrate having an advanced low k material thereon according to one aspect of the present invention.
Figure 6B:
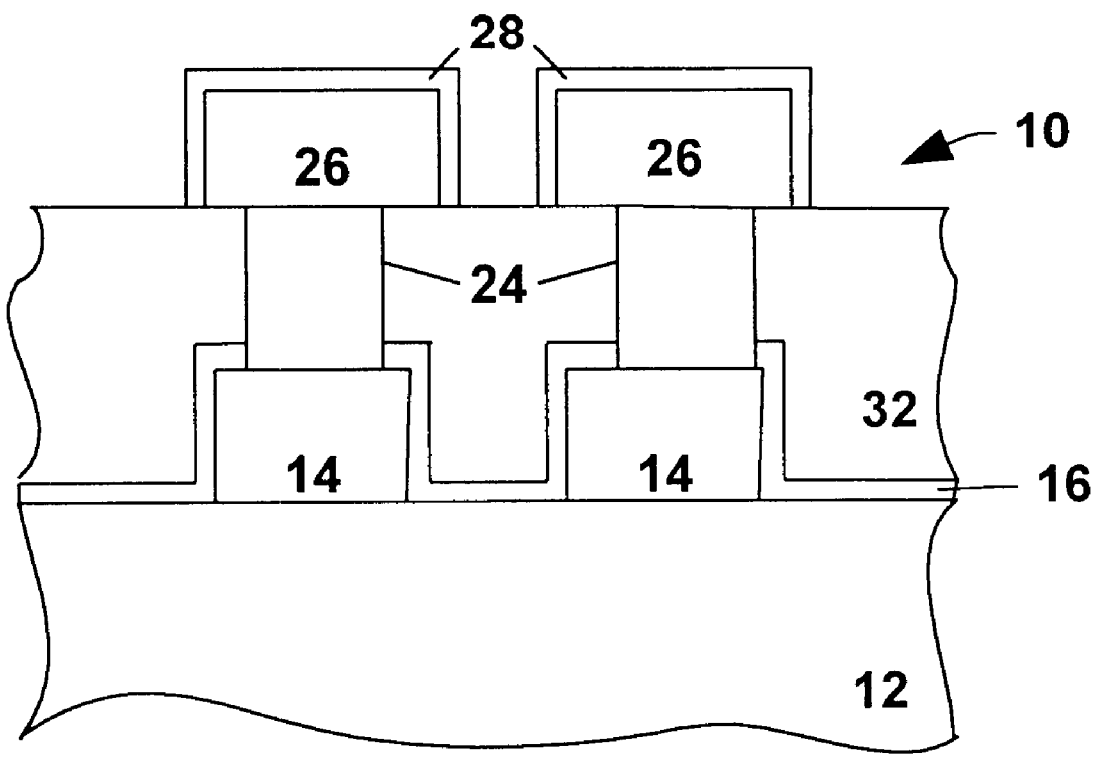
FIG. 6B illustrates a cross-sectional view of a semiconductor substrate having an advanced low k material thereon according to another aspect of the present invention.

Referring to FIGS. 6A and 6B, two alternative embodiments of forming the advanced low k material of the present invention are explained in more detail. Specifically referring to FIG. 6A, the spin-on material layer 18 is substantially or completely removed from the structure 10. As a result, the advanced low k material 30 is formed around the metal lines 14, 26 and vias 24. The advanced low k material 30 primarily contains air, thus it has a dielectric constant approaching 1. The spin-on material layer 18 is removed from the structure 10 without substantially damaging the metal lines 14, 26 and vias 24 (that is, without corroding, cracking, or breaking the metal lines 14, 26 and vias 24). As examples wherein the spin-on material layer 18 contains a silicate, removal is achieved using an acid solution or a halocarbon plasma. As examples wherein the spin-on material layer 18 contains a low k polymer material, removal is achieved using pyrolysis, an oxygen containing plasma, an acid solution or an organic solvent.

Specifically referring to FIG. 6B, the spin-on material layer 18 is partially removed from the structure 10. As a result, the advanced low k material 32 is formed around the metal lines 14, 26 and vias 24. The advanced low k material 32 primarily contains air or vacuum and the remaining portion of the spin-on material, thus it has a dielectric constant approaching 1. The spin-on material layer 18 is partially removed from the structure 10 without substantially damaging the metal lines 14, 26 and vias 24 (that is, without corroding, cracking, or breaking themetal lines 14, 26 and vias 24). Partial removal of the spin-on material layer 18 means that air voids or vacuum pockets are formed and interdispersed throughout the remaining portion of the spin-on material thereby forming a porous structure of the advanced low k material 32. The porous structure of the advanced low k material 32 is illustrated in FIG. 7. FIG. 7 shows a plurality of voids and the remaining portion of the spin-on material.

As examples wherein the spin-on material layer 18 contains a silicate, partial removal is achieved using pyrolysis, a dilute acid solution or a hydrocarbon plasma.

As examples wherein the spin-on material layer 18 contains a low k polymer material, partial removal is achieved using an halocarbon containing plasma, an dilute acid solution or a semi-miscible organic solvent.

In both FIGS. 6A and 6B, the advanced low k material 30 and the advanced low k material 32 simultaneously.serve as an interlevel dielectric layer electrically insulating vertically spaced layers and as an innerlayer dielectric electrically insulating horizontally adjacent interconnect lines. However, the advanced low k material 30 and/or the advanced low k material 32 may serve as one of an interlevel dielectric layer and an innerlayer dielectric.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of.the other embodiments as may be desired and advantageous for any given or particular application.

What is claimed is:

1. A method of forming an advanced low k material between metal lines on a semiconductor substrate, comprising:

providing the semiconductor substrate having a plurality of metal lines thereon;

depositing one layer of a spin-on material over the semiconductor substrate having the plurality of metal lines thereon, wherein the spin-on material is a low k polymer material, and pyrolizing the semiconductor substrate at a temperature from about 600° C. to about 2,000° C. for a time from about 2 seconds to about 10 minutes whereby at least a portion of the spin-on material is removed, thereby forming the advanced low k material comprising at least one air void between the metal lines, the advanced low k material having a porous structure and a dielectric constant of about 2 or less.

2. The method of claim 1, wherein the semiconductor substrate is pyrolized at a temperature from about 600° C. to about 1,500° C. for a time from about 10 seconds to about 5 minutes.

3. The method of claim 1, wherein the air void comprises an inert gas.

4. A method of forming a semiconductor structure, comprising:

forming a first plurality of metal lines on the semiconductor structure;

depositing one layer of a spin-on material over the semiconductor substrate having the plurality of metal lines thereon, wherein the spin-on material is a low k polymer material;

forming a plurality of openings in the spin-on material exposing a portion of the metal lines and depositing metal to form a plurality of metal vias in the openings;

forming a second plurality of metal lines over at least a portion of the metal vias; and pyrolizing the semiconductor structure at a temperature from about 600° C. to about 1,500° C. whereby a portion of the spin-on material is removed, thereby forming a porous advanced low k material comprising a plurality of voids between the metal lines, the porous advanced low k material having a porous structure and a dielectric constant of about 1.75 or less.

5. The method of claim 4, wherein the low k polymer material comprises a polyimide, a fluorinated polyimide, a polysilsequioxane, a benzocyclobutene, a poly(arylene ester), parylene F, parylene N, or an amorphous polytetrafluoroethylene.

6. The method of claim 4, wherein the semiconductor structure is pyrolized at a temperature from about 700° C. to about 1,300° C. for a time from about 20 seconds to about 2 minutes.

7. The method of claim 4, wherein the first plurality of metal lines and the second plurality of metal lines comprise copper, tungsten, gold, silver, aluminum, and alloys thereof and a barrier layer comprising titanium nitride, tungsten, tantalum, titanium tungsten, tantalum silicon nitride, tungsten nitride, niobium, molybdenum or combinations thereof.

8. The method of claim 4, wherein the advanced low k material has a dielectric constant of about 1.25 or less.

* * * * *